US012663724B2

(12) United States Patent
Yang et al.

(10) Patent No.: US 12,663,724 B2
(45) Date of Patent: Jun. 23, 2026

(54) LITHOGRAPHY SYSTEM WITH NON-INVASIVE MONITORING AND METHODS

(71) Applicant: Taiwan Semiconductor Manufacturing Co., Ltd., Hsinchu (TW)

(72) Inventors: Chi Yang, Hsinchu (TW); Po-Yuan Yeh, Hsinchu (TW); Che-Hsin Lin, Hsinchu (TW); Jen Chieh Yu, Hsinchu (TW); Chung Wen Luo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 300 days.

(21) Appl. No.: 18/483,038

(22) Filed: Oct. 9, 2023

(65) Prior Publication Data

US 2025/0116938 A1 Apr. 10, 2025

(51) Int. Cl.
*G03F 7/00* (2006.01)
*G03F 7/20* (2006.01)

(52) U.S. Cl.
CPC ........ *G03F 7/70033* (2013.01); *G03F 7/2004* (2013.01); *G03F 7/70025* (2013.01); *G03F 7/7015* (2013.01)

(58) Field of Classification Search
CPC .............. G03F 7/70033; G03F 7/2004; G03F 7/70025; G03F 7/7015
USPC ...................................................... 250/504 R
See application file for complete search history.

(56) References Cited

U.S. PATENT DOCUMENTS

2017/0350745 A1* 12/2017 Nagano .............. G01F 23/0007
2019/0155157 A1* 5/2019 Chen ................... G03F 7/70008
2022/0276572 A1* 9/2022 Chen ..................... H05G 2/002

FOREIGN PATENT DOCUMENTS

CN       103940493 A    7/2014
CN       115900883 A    4/2023
TW       202337273 A    9/2023

* cited by examiner

*Primary Examiner* — Jason L Mccormack
(74) *Attorney, Agent, or Firm* — Seed IP Law Group

(57) ABSTRACT

A method includes: forming a mask layer on a semiconductor wafer; forming a tin droplet, including: supplying tin to a high-pressure reservoir from a low-pressure reservoir; monitoring a level of tin in the high-pressure reservoir by at least two electrodes attached to the high-pressure reservoir; in response to the level of the tin exceeding a threshold value, supplying the tin to a droplet generator from the high-pressure reservoir; forming the tin droplet by the droplet generator using the tin supplied from the high-pressure reservoir; generating light by the tin droplet; and patterning the mask layer by the light.

14 Claims, 10 Drawing Sheets

LITHOGRAPHY SYSTEM WITH NON-INVASIVE MONITORING AND METHODS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
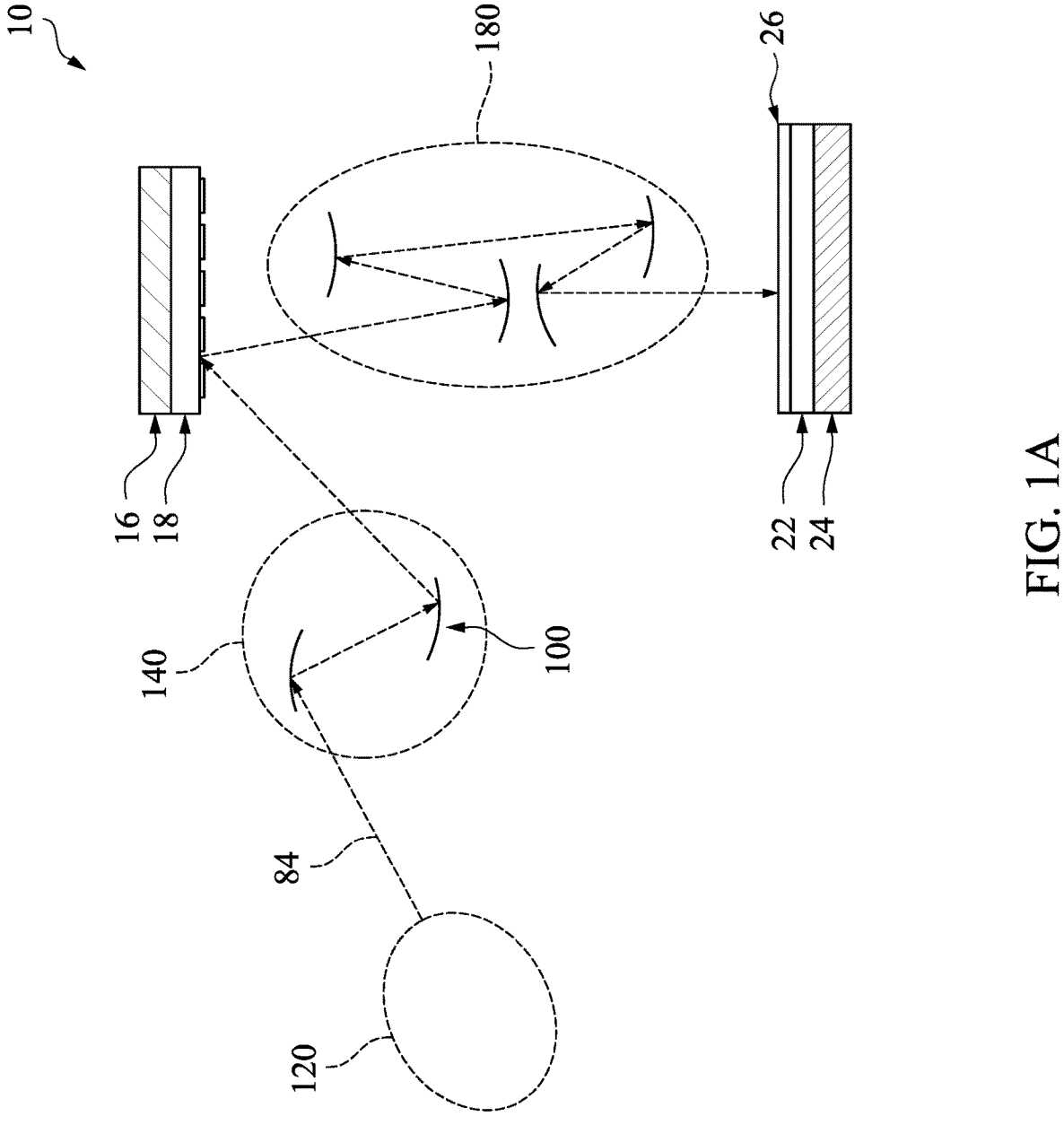
FIGS. 1A and 1B are views of portions of a lithography scanner according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms.

The present disclosure is generally related to lithography equipment for fabricating semiconductor devices, and more particularly to a tin supply apparatus and method that improves continuous supply of liquid tin to a droplet generator of an extreme ultraviolet (EUV) lithography apparatus.

Dimension scaling down is increasingly difficult in advanced technology nodes. Lithography techniques employ ever shorter exposure wavelengths, including deep ultraviolet (DUV; about 193-248 nanometers or "nm"), extreme ultraviolet (EUV; about 10-100 nanometers; particularly 13.5 nanometers), and X-ray (about 0.01-10 nanometers) to ensure accurate patterning at the scaled-down dimensions. In an EUV scanner, EUV light is generated by a light source by striking tin droplets with laser pulses, and is reflected toward a wafer by multiple mirrors and a reflective mask.

In new generation EUV light sources, tin liquid can be refilled without stopping operation of the lithography system. Solid tin is first inserted into a chamber, such as a low-pressure reservoir that has a heater. The solid tin is then melted to form liquid tin, which is transported by applying a small pressure (e.g., 10 psi to 30 psi) to another heated reservoir. The another heated reservoir is used for high-pressure operation. Using communication tubes, liquid tin from the high-pressure reservoir(s) is continuously driven to the droplet generator, which forms micro-scale tin droplets and injects them into a source vessel.

The high-pressure reservoir(s) are unable to measure how much liquid tin is present therein due to the reservoir(s) being heated (e.g., up to 250 degrees Celsius or above) and highly pressurized (e.g., up to 15,000 psi). While the level may be calculated and simulated based on timed consumption of the solid tin, such calculations are very unreliable and can lead to false alarms that the tin supply system has run out of tin. This is at least due to mechanical tolerance of transport pipes, tin leaks in valves and voids formed within the system. As a result, the tin supply system may stop operation by activating interlocks and, in a worse case, the tin supply system and/or the lithography system may be damaged. Neither physical probes for direct level measurement nor weight measurements are available because any invasive method deteriorates the ability of the tin supply system to sustain high pressure. Further, any invasive probe or sensor would potentially be contaminated due to the target liquid being metallic. The sensor may also not survive or maintain reliability under the high temperature and high pressure operating regime inside the high-pressure reservoir(s).

In embodiments of this disclosure, a level measurement system or monitoring assembly is included on the high-pressure reservoir(s) used in the EUV light source, which provides non-invasive and accurate level measurement of the liquid tin inside the high-pressure reservoir(s). In the embodiments, a non-invasive method measures the liquid level of highly pressurized metallic liquid. By measuring capacitance and frequency response through high frequency signal input within the reservoirs, time-varying level of liquid tin can be measured. Electrodes for performing measurements are formed by a highly conductive layer(s) wrapped in an insulation layer(s). To improve measurement quality, several electrode placement embodiments are provided. The electrode setup may be in parallel or orthogonal for better resolution. The electrode(s) may have shape that is a stripe, ring, or any special geometry. Because there is no invasive device for the measurement, the reservoirs can sustain high-pressure loads. The measurement system provides accuracy and human safety during measurement of liquid tin level, and can be further used for alarms, security, and issuance of diagnostics.

FIG. 1A is a schematic and diagrammatic view of a lithography exposure system 10, in accordance with some embodiments. The lithography exposure system 10 is described in detail to provide context for understanding a measurement system for a liquid tin reservoir that supplies liquid tin to a droplet generator of the lithography exposure system 10.

In some embodiments, the lithography exposure system 10 is an extreme ultraviolet (EUV) lithography system designed to expose a resist layer by EUV radiation, and may also be referred to as the EUV system 10. The EUV system 10 may also be referred to as an EUV scanner or lithography scanner. The lithography exposure system 10 includes a light source 120, an illuminator 140, a mask stage 16, a projection optics module (or projection optics box (POB)) 180 and a substrate stage 24, in accordance with some embodiments. The elements of the lithography exposure system 10 can be added to or omitted, and the disclosure should not be limited by the embodiment.

The light source 120 is configured to generate light radiation having a wavelength ranging between about 1 nm and about 100 nm in certain embodiments. In one particular example, the light source 120 generates an EUV radiation with a wavelength centered at about or substantially 13.5 nm. Accordingly, the light source 120 is also referred to as an EUV radiation source. However, it should be appreciated that the light source 120 should not be limited to emitting EUV radiation. The light source 120 can be utilized to perform any high-intensity photon emission from excited target fuel.

In various embodiments, the illuminator 140 includes various refractive optic components, such as a single lens or a lens system having multiple reflectors 100, for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In embodiments in which the light source 120 generates light in the EUV wavelength range, reflective optics are employed. In some embodiments, the illuminator 140 includes at least two lenses, at least three lenses, or more.

The mask stage 16 is configured to secure the mask 18. In some embodiments, the mask stage 16 includes an electrostatic chuck (e-chuck) to secure the mask 18. One reason an e-chuck is beneficial is that gas molecules absorb EUV radiation and the e-chuck is operable in the lithography exposure system for the EUV lithography patterning that is maintained in a vacuum environment to avoid EUV intensity loss. In the present disclosure, the terms mask, photomask, and reticle are used interchangeably. In the present embodiment, the mask 18 is a reflective mask. One example structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate. The mask stage 16 is operable to translate in two horizontal directions, such as an X-axis direction and a Y-axis direction, so as to expose multiple different regions of the semiconductor wafer 22 to light having a pattern generated by the mask 18. The semiconductor wafer 22 may have a mask layer 26 thereon, which may be a photoresist layer that is sensitive to the light carrying the pattern of the mask 18.

The projection optics module (or projection optics box (POB)) 180 is configured for imaging the pattern of the mask 18 on to a semiconductor wafer 22 secured on the substrate stage 24 of the lithography exposure system 10. In some embodiments, the POB 180 has refractive optics (such as for a UV lithography exposure system) or alternatively reflective optics (such as for an EUV lithography exposure system) in various embodiments. The light directed from the mask 18, carrying the image of the pattern on the mask, is collected by the POB 180. The illuminator 140 and the POB 180 may be referred to collectively as an optical module of the lithography exposure system 10. In some embodiments, the POB 180 includes at least six reflective optics.

In some embodiments, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), capacitors, inductors, diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation. Various components including those described above are integrated together and are operable to perform lithography processes.

The lithography exposure system 10 may further include other modules or be integrated with (or be coupled with) other modules, such as a cleaning module designed to provide hydrogen gas to the light source 120 and a tin supply system designed to provide liquid tin to the light source 120. The hydrogen gas helps reduce contamination in the light source 120. Further description of the light source 120 is provided with reference to FIG. 1B.

Figure 1B:
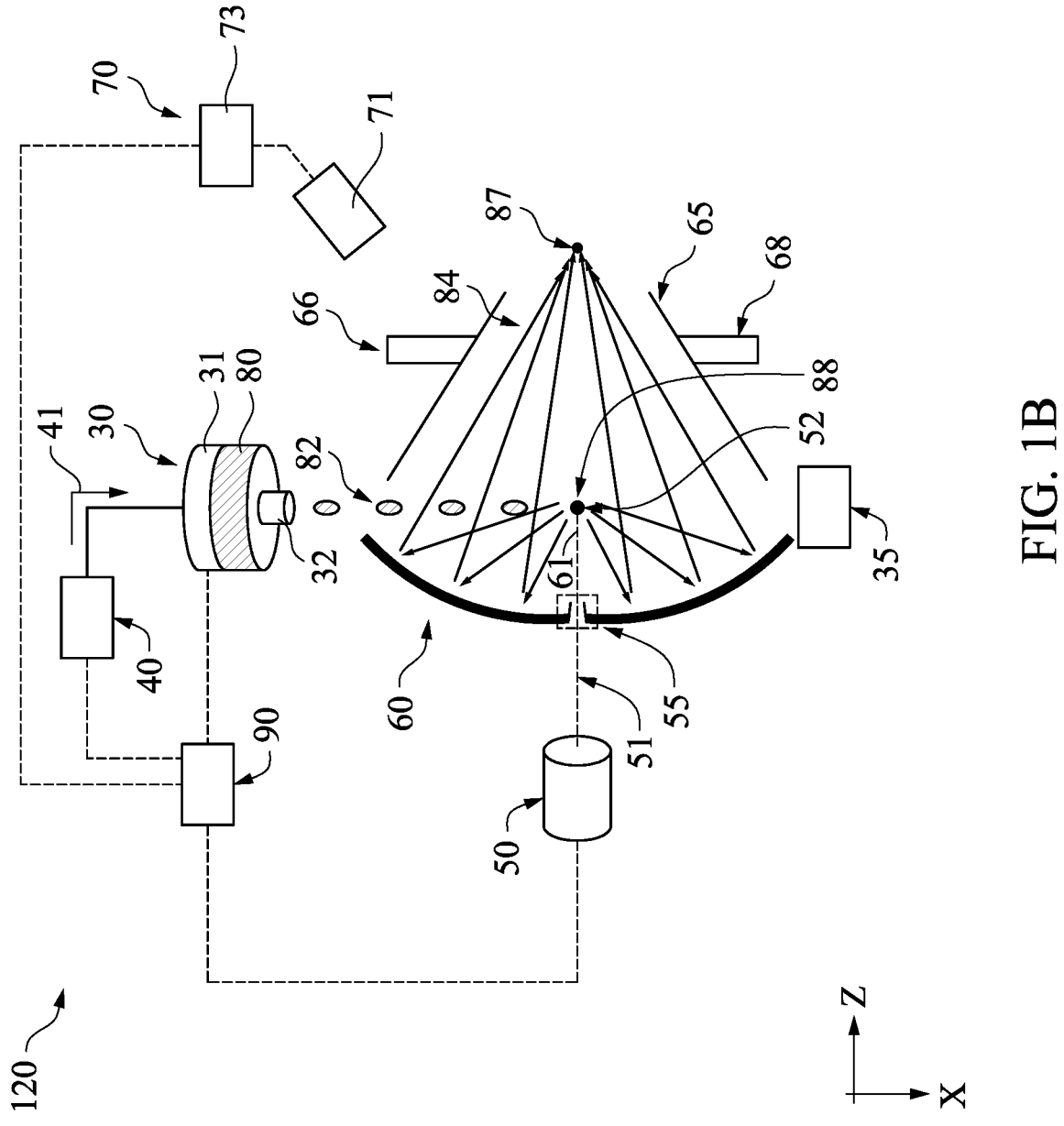

In FIG. 1B, the light source 120 is shown in a diagrammatical view, in accordance with some embodiments. In some embodiments, the light source 120 employs a dual-pulse laser produced plasma (LPP) mechanism to generate plasma 88 and further generate EUV radiation from the plasma. The light source 120 includes a droplet generator 30, a droplet receptacle 35, a laser generator 50, a laser produced plasma (LPP) collector 60, a monitoring device 70 and a controller 90. Some or all of the above-mentioned elements of the light source 120 may be held under vacuum. It should be appreciated that the elements of the light source 120 can be added to or omitted, and should not be limited by the embodiment.

The droplet generator 30 is configured to generate a plurality of droplets 82, which may be elongated, of a target fuel 80 to a zone of excitation at which at least one laser pulse 51 from the laser generator 50 hits the droplets 82, as shown in FIG. 1B. In an embodiment, the target fuel 80 includes tin (Sn). In an embodiment, the droplets 82 may be formed with an elliptical shape. In an embodiment, the droplets 82 are generated at a rate of about 50 kilohertz (kHz) and are introduced into the zone of excitation in the light source 120 at a speed of about 70 meters per second (m/s). Other material can also be used for the target fuel 80, for example, a tin containing liquid material such as eutectic alloy containing tin, lithium (Li), and xenon (Xe). The target fuel 80 in the droplet generator 30 may be in a liquid phase.

The laser generator 50 is configured to generate at least one laser pulse to allow the conversion of the droplets 82 into plasma 88. In some embodiments, the laser generator 50 is configured to produce a laser pulse 51 to the lighting point 52 to convert the droplets 82 to plasma 88 which generates EUV radiation 84. The laser pulse 51 is directed through window (or lens) 55, and irradiates droplets 82 at the lighting point 52. The window 55 is formed in the sectional collector 60 and adopts a suitable material substantially transparent to the laser pulse 51. The droplet receptacle 35 catches and collects unused droplets 82 and/or scattered material of the droplets 82 resulting from the laser pulse 51 striking the droplets 82.

The plasma emits EUV radiation 84, which is collected by the collector 60. The collector 60 further reflects and focuses the EUV radiation 84 for the lithography processes performed through an exposure tool. In some embodiments, the collector 60 has an optical axis 61 which is parallel to the z-axis and perpendicular to the x-axis. The collector 60 may include a single section, as shown, or at least two sections that are offset from each other in the z-axis direction. The collector 60 may further include a vessel wall 65 having first and second pumps 66, 68 attached thereto. In some embodiments, the first and second pumps 66, 68 include scrubbers configured to remove particulates and/or gases from the collector 60. The first and second pumps 66, 68 may be collectively referred to as "the pumps 66, 68" herein.

In an embodiment, the laser generator 50 is a carbon dioxide (CO2) laser source. In some embodiments, the laser generator 50 is used to generate the laser pulse 51 with single wavelength. The laser pulse 51 is transmitted through an optic assembly for focusing and determining incident angle of the laser pulse 51. In some embodiments, the laser pulse 51 has a spot size of about 200-300 μm, such as 225 μm. The laser pulse 51 is generated to have certain driving power to meet wafer production targets, such as a throughput of 125 wafers per hour (WPH). For example, the laser pulse 51 is equipped with about 23 kW driving power. In various embodiments, the driving power of the laser pulse 51 is at least 20 kW, such as 27 kW.

The monitoring device 70 is configured to monitor one or more conditions in the light source 120 so as to produce data for controlling configurable parameters of the light source 120. In some embodiments, the monitoring device 70 includes a metrology tool 71 and an analyzer 73. In cases where the metrology tool 71 is configured to monitor condition of the droplets 82 supplied by the droplet genera-tor 30, the metrology tool 71 may include an image sensor, such as a charge coupled device (CCD), complementary metal oxide semiconductor sensor (CMOS) sensor or the like. The metrology tool 71 produces a monitoring image including image or video of the droplets 82 and transmits the monitoring image to the analyzer 73. In cases where the metrology tool 71 is configured to detect energy or intensity of the EUV light 84 produced by the droplet 82 in the light source 120, the metrology tool 71 may include a number of energy sensors. The energy sensors may be any suitable sensors that are able to observe and measure energy of electromagnetic radiation in the ultraviolet region.

The analyzer 73 is configured to analyze signals produced by the metrology tool 71 and outputs a detection signal to the controller 90 according to an analyzing result. For example, the analyzer 73 includes an image analyzer. The analyzer 73 receives the data associated with the images transmitted from the metrology tool 71 and performs an image analysis process on the images of the droplets 82 in the excitation zone. Afterwards, the analyzer 73 sends data related to the analysis to the controller 90. The analysis may include a flow path error or a position error.

In some embodiments, two or more metrology tools 71 are used to monitor different conditions of the light source 120. One is configured to monitor condition of the droplets 82 supplied by the droplet generator 30, and the other is configured to detect energy or intensity of the EUV light 84 produced by the droplet 82 in the light source 120. In some embodiments, the metrology tool 71 is a final focus module (FFM) and positioned in the laser generator 50 to detect light reflected from the droplet 82.

The controller 90 is configured to control one or more elements of the light source 120. In some embodiments, the controller 90 is configured to drive the droplet generator 30 to generate the droplets 82. In addition, the controller 90 is configured to drive the laser generator 50 to fire the laser pulse 51. The generation of the laser pulse 51 may be controlled to be associated with the generation of droplets 82 by the controller 90 so as to make the laser pulse 51 hit each droplet 82 in sequence.

In some embodiments, the droplet generator 30 includes a reservoir 31 and a nozzle assembly 32. The reservoir 31 is configured for holding the target material 80. In some embodiments, one gas line 41 is connected to the reservoir 31 for introducing pumping gas, such as argon, from a gas source 40 into the reservoir 31. By controlling the gas flow in the gas line 41, the pressure in the reservoir 31 can be manipulated. For example, when gas is continuously sup-plied into the reservoir 31 via the gas line 41, the pressure in the reservoir 31 increases. As a result, the target material 80 in the reservoir 31 can be forced out of the reservoir 31 in the form of droplets 82. The reservoir 31 receives the target material 80, e.g., liquid tin, from a target supply system that may include one or more low-pressure reservoirs and one or more high-pressure reservoirs. Target supply systems in accordance with various embodiments are described in detail below with reference to FIGS. 2-7. Operation of the target supply systems during fabrication of an integrated circuit (IC) device is described with reference to flowcharts depicted in FIGS. 8 and 9.

Figure 2:
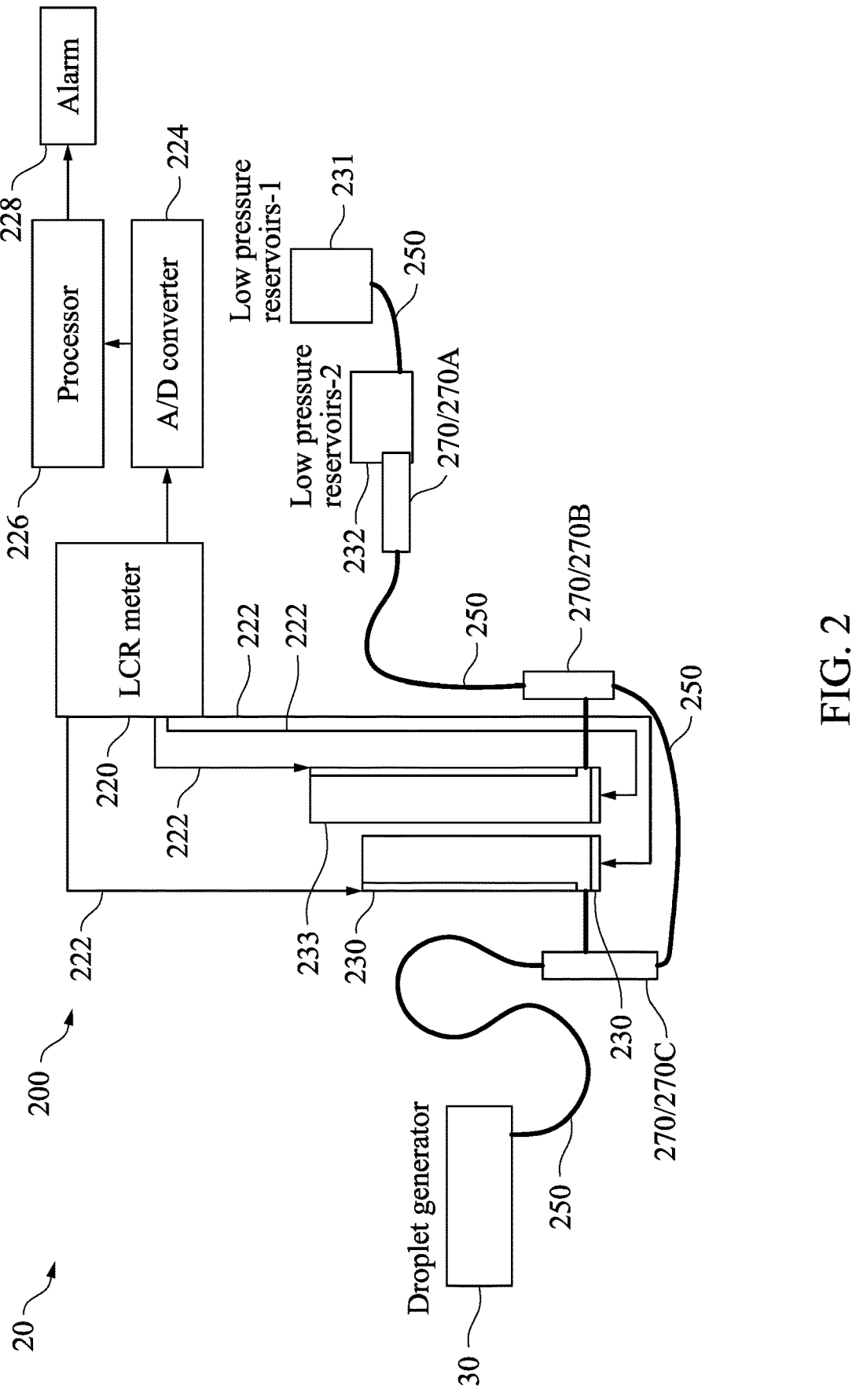
FIGS. 2-7 are views of various embodiments of a tin supply with measurement system of the lithography scanner according to various aspects of the present disclosure.

FIG. 2 is a diagrammatic view of a supply system 20 that supplies a target material to the droplet generator 30 of the light source 120 in accordance with various embodiments. The supply system 20 may be referred to alternately as a target supply system, tin supply system or liquid tin supply system throughout the description. The supply system 20 is monitored by a measurement system or "monitoring assem-bly" 200 that provides non-invasive measurement of target material level in one or more reservoirs thereof.

The supply system 20 includes a first reservoir 231, a second reservoir 232, one or more third reservoirs 233, transport lines 250 and valves 270.

The first reservoir 231 may be a low-pressure reservoir and may be referred to as the low-pressure reservoir 231. The first reservoir 231 may receive solid tin and heat the solid tin to form liquid tin that may be transported to the second reservoir 232. In some embodiments, the low-pressure reservoir 231 includes one or more of a reservoir container, a heater, a pressure controller, a thermally insulated jacket or wall, an access port and a pressure monitoring and/or control interface. The reservoir container may be a non-reactive container capable of housing solid tin. The container may be constructed from high-strength, non-corrosive material, such as stainless steel or an alloy with similar properties. The container is beneficial to withstand a range of operating temperatures and pressures associated with storing solid tin in its stable phase. A pressure controller may be integrated into the reservoir container. The pressure controller may regulate internal pressure of the container to maintain the pressure within a selected low-pressure range. The pressure controller may include pressure sensors, regulators and/or relief valves, which are beneficial to maintaining the pressure at a level that is beneficial for melting the solid tin to form liquid tin. The reservoir container may be surrounded by a thermally insulated jacket or wall. The wall acts as a thermal barrier, preventing external temperature fluctuations from affecting stability of the tin within the reservoir container. An access port with a securely sealable lid may be provided on the reservoir container to allow for loading of the solid tin into the reservoir container and optionally extraction thereof. The access port may be operable to form an airtight seal to prevent leakage of gas or solid tin. An external interface may be included in the first reservoir 231 for an operator to monitor internal pressure and adjust the pressure controller accordingly. The interface may include pressure gauges, electronic sensors, control knobs or buttons, and the like.

The liquid tin generated by the first reservoir 231 may be transported to the second reservoir 232 via one of the transport lines 250. A small pressure, such as about 10 psi to 30 psi, may be applied to the first reservoir 231 to transport the liquid tin to the second reservoir 232. The second reservoir 232 may be similar in most respects to the first reservoir 231, with some slight differences related to the second reservoir 232 holding liquid tin instead of primarily solid tin. The second reservoir 232 may be configured to store tin in a liquid phase and deliver the liquid tin to the third reservoir(s) 233. The second reservoir 232 may include or be connected to one of the valves 270, as depicted in FIG. 2. For example, the valve 270 may be mounted to the second reservoir 232, formed integrally with the second reservoir 232 or connected to the second reservoir 232 via one of the transport lines 250. A small pressure (e.g., about 10 psi to 30 psi) may be applied to the second reservoir 232 to transport the liquid tin into the transport lines 250 for delivery to the third reservoir 233.

The valve 270 may be any suitable valve for controlling flow of the liquid tin from inside the second reservoir 232 into the transport line 250. For example, the valve 270 may be a ball valve, a globe valve, a gate valve, a butterfly valve, a plug valve, a diaphragm valve, a needle valve or the like.

The third reservoir 233 may be a high-pressure reservoir that provides various benefits for supplying the liquid tin to the droplet generator 30 and forming the tin droplets 82 used in generating the EUV light 84. To achieve high EUV light output, a large number of tin droplets are generated and efficiently converted into plasma. A high-pressure reservoir can be beneficial for the storage and rapid release of liquid tin droplets, such that a continuous and intense EUV light production process occurs. EUV light generation benefits from smaller tin droplets, which may facilitate higher conversion efficiencies. High-pressure reservoirs with well-designed nozzles or orifices can be beneficial to generate tin droplets with a selected size range, improving the conversion process. The high-pressure release of tin droplets can lead to better plasma formation during laser-target interaction, which can result in more intense and stable EUV light emission, thereby improving performance and reliability of EUV light sources. In a pulsed mode, where the laser and droplet generation are synchronized, the high-pressure reservoir can be beneficial to delivering droplets with precise timing, aligning with the laser pulses and ensuring consistent and controlled EUV light emission.

The third reservoir 233 may be similar in many respects to the low-pressure reservoirs 231, 232, but with some differences to accommodate holding liquid tin at much higher pressures. For example, the high-pressure reservoir 233 is configured to store materials at elevated pressures, such as at pressures higher than atmospheric pressure. The pressure inside a high-pressure reservoir can be several times greater than the ambient pressure. As such, the high-pressure reservoir(s) 233 are configured to withstand forces exerted by the high internal pressure. For example, the high-pressure reservoir(s) 233 may be constructed using strong and durable materials that can withstand the elevated pressures safely, such as high-strength alloys or thick-walled containers that are beneficial to maintaining structural integrity of the reservoir. The high-pressure reservoir(s) 233 may incorporate more sophisticated pressure control elements to regulate the pressure within safe operating limits and prevent over-pressurization. Some examples of pressure control elements may include pressure relief valves, pressure sensors and transmitters, proportional-integral-derivative (PID) controllers, pressure regulators, solenoid valves, flow control valves, computerized control systems, emergency shutdown systems and the like.

As depicted in FIG. 2, the supply system 20 includes two high-pressure reservoirs 233, in some embodiments. Valves 270B, 270C may be positioned between the valve 270A attached to the second reservoir 232 and the respective high-pressure reservoirs 233, as shown. In the embodiment depicted in FIG. 2, the valve 270B is in direct fluid communication with the valve 270A via the transport line 250, and the valve 270C is in indirect fluid communication with the valve 270A via the valve 270B and an additional transport line 250. Each of the valves 270B, 270C may be connected to the respective high-pressure reservoir 233 via another transport line 250, as shown. Each of the valves 270B, 270C may be two-way valves that allow flow of fluid in and out of the high-pressure reservoirs 233 therethrough.

The high-pressure reservoirs 233 are in fluid communication with the droplet generator 30 via another transport line 250. Using the transport line 250, liquid tin from the high-pressure reservoirs 233 may be driven continuously to the droplet generator 30 for forming micro-scale droplets 82 and injecting them into a source vessel. Each of the high-pressure reservoirs 233 may deliver liquid tin directly to the droplet generator 30 via the valves 270 and the transport lines 250. In some embodiments, one of the high-pressure reservoirs 233 delivers liquid tin indirectly to the droplet generator 30 via the other of the high-pressure reservoirs 233, such that the one may act as a reserve storage for the other.

The high-pressure reservoirs 233 are configured to drive liquid tin continuously to the droplet generator 30. However, the supply system may stop operation when a level of the liquid tin is too low or determined falsely to be too low. For example, interlocks may be activated and, in a worse case, the supply system 20 and/or the lithography system 10 may be damaged. As such, the supply system 20 includes a monitoring assembly 200 that is non-invasive and provides highly accurate measurement of levels of liquid tin in the high-pressure reservoirs 233, which can avoid the above problems and aid in achieving continuous delivery of liquid tin to the droplet generator 30 without abrupt stoppages that can damage the supply system 20 and/or the lithography system 10.

FIG. 2 depicts a monitoring assembly 200 that, in operation, measures capacitance associated with level of liquid tin in the reservoir 233. The monitoring assembly 200 has at least two electrodes 230 that are attached to an exterior of the reservoir 233 and includes one or more of a high-definition capacitance measuring device 220 (e.g., an LCR meter 220 or microcontroller 220), an analog-to-digital convertor (ADC) 224, a processor or controller 226 and an alarm 228. Arrangement and structure of the electrodes 230 are described in greater detail with reference to FIGS. 3A-7.

The LCR meter 220 is operable to measure inductance, capacitance and/or resistance across two or more input ports thereof. In some embodiments, the LCR meter 220 is operable to measure capacitance by frequency input. Each input port may be electrically connected to a respective one of the electrodes 230 by a conductive line 222, such as an electrical cable or wire. As such, the LCR meter 220 is operable to measure capacitance(s) across two or more electrodes 230 that are attached to one or more respective walls of one of the reservoir(s) 233. The LCR meter 220 may output an analog signal (e.g., an analog voltage) that is associated with the measured capacitance via an output port.

In some embodiments, the LCR meter 220 measures the capacitance via a four-terminal pair measurement arrangement. The measurement may be a parallel measurement or a series measurement. In some embodiments, impedance of the LCR meter 220 used during the parallel measurement may be about 10 kiloohms. In some embodiments, impedance of the LCR meter 220 used during the series measurement may be about 10 ohms. The LCR meter 220 may input a frequency-varying signal, such as a high-frequency signal, to measure a frequency response of the electrodes 230. The frequency of the signal may be about 1 kiloHertz (kHz), 100 kHz, 1 MHz, or the like.

The capacitance across the electrodes 230 may be proportional to volume of liquid tin in the reservoir 233. For example, the capacitance may increase with increased volume of liquid tin and may decrease with decreased volume of liquid tin. In some embodiments, for a range of about 0 centimeters to about 5 centimeters (cm) of liquid tin, the capacitance may range between two values in the hundreds of picofarads (pF), such as between about 170 pF and about 171 pF or between about 157 pF and about 158 pF. These are only examples, and other values may be associated with the levels of liquid tin in the reservoir 233. The values may vary based on size and positioning of the electrodes 230, frequency used by the LCR meter 220 to measure the capacitance (e.g., 1 kHz, 100 kHz, 1 MHz, etc.), structure and material composition of the electrodes 230, structure and material composition of walls of the reservoir 233, and the like.

In some embodiments, change in the capacitance value is associated with level (e.g., height) of liquid tin in the reservoir 233. For example, the capacitance value may increase by about 0.1 pF for each centimeter increase of liquid tin in the reservoir 233, such as about 0.04 pF/cm, 0.08 pF/cm, 0.1 pF/cm, 0.12 pF/cm, or another value. The change in the capacitance value may vary based on the frequency used by the LCR meter 220 to measure the capacitance. For example, a lower frequency may be associated with a higher change in capacitance value (e.g., 0.12 pF/cm for 1 kHz measurement frequency) and a higher frequency may be associated with a lower change in capacitance value (e.g., 0.08 pF/cm for 1 MHz measurement frequency). Noise levels associated with the measurement of the capacitance may vary based on the frequency used to measure the capacitance. For example, higher frequency may be associated with lower noise levels and lower frequency may be associated with higher noise levels. As such, in some embodiments, the LCR meter 220 may measure the capacitance at a frequency in a range of about 50 kHz to about 200 kHz, such as about 100 kHz or substantially 100 kHz.

The ADC 224 may be any suitable analog-to-digital converter and is operable to output a digital signal (e.g., a sequence of high and low voltages) that is associated with the analog voltage outputted by the LCR meter 220. The digital signal is associated with the capacitance across the electrodes 230. In some embodiments, the ADC 224 is included in the LCR meter 220. For example, the LCR meter 220 may be a digital meter that outputs a digital signal that represents capacitance of the electrodes 230.

The processor or controller 226 may be any suitable processor, microprocessor, controller, microcontroller or the like, and is operable to execute one or more instructions based on the digital signal outputted by the ADC 224. For example, the processor 226 may store the digital signal in a memory (e.g., a register) thereof as a stored value, compare the stored value against a selected threshold value, and output a control signal when the stored value exceeds or is less than the threshold value. The stored value is associated with a capacitance across the electrodes 230 due to being based on the digital signal, which is based on the analog signal measured by the LCR meter 220.

To detect a low level of liquid tin in the reservoir 233, the threshold value may be a low value associated with a low capacitance, which is associated with a low level of liquid tin. When the stored value is less than the low value, the processor 226 may execute instructions to generate a low tin level signal that may trigger an action. For example, an alarm 228 may be in data communication or electrical communication with the processor 226. When the low tin level signal is generated, the alarm 228 may be triggered to sound. The alarm 228 may be operable to generate an audible sound that alerts a human operator of the low tin level in the reservoir 233. In some embodiments, the action triggered may be generation of a visual notification or alert on a display device of a user interface, such as a computer terminal operated by the human operator. In some embodiments, the action triggered may be continuous output of an estimated tin level of the reservoir 233 to the user interface. The estimated tin level may be a percent, a volume value (e.g., number of liters remaining), or the like. In some embodiments, the action triggered may be an automated routine that performs one or more of refilling solid tin in the first reservoir 231, putting the lithography system 10 into a soft shutdown mode, or other suitable action that protects the lithography system 10 and/or the supply system 20 from damage due to running out of liquid tin.

Figure 3B:
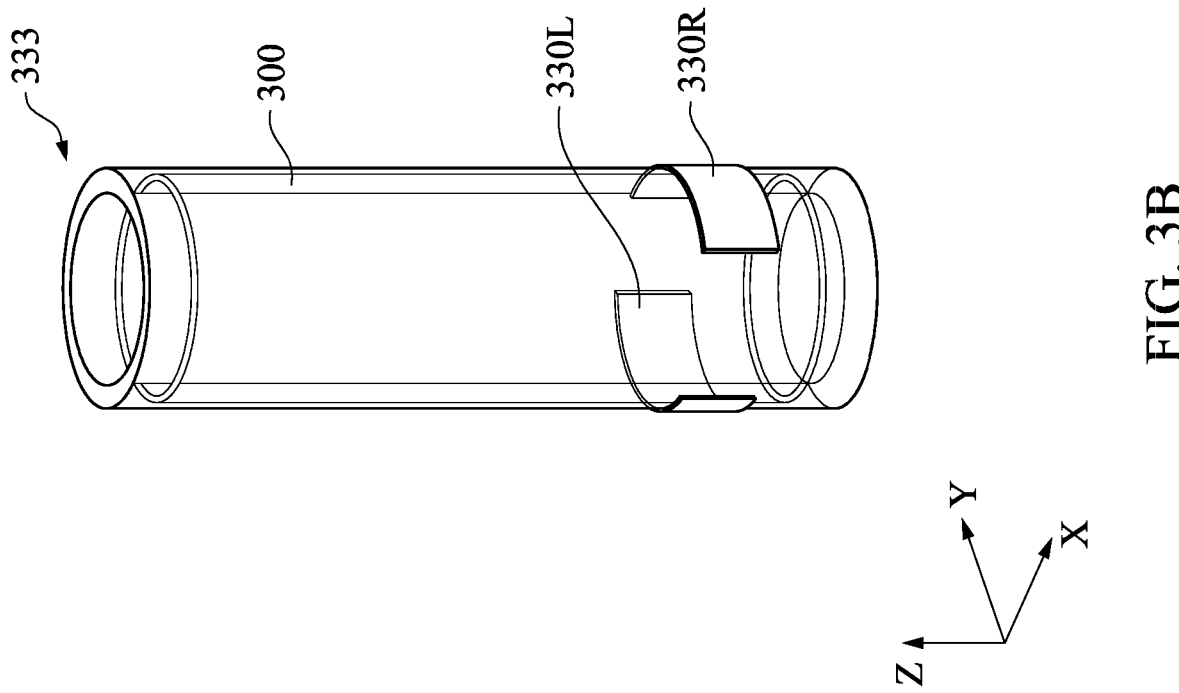
Figure 3A:
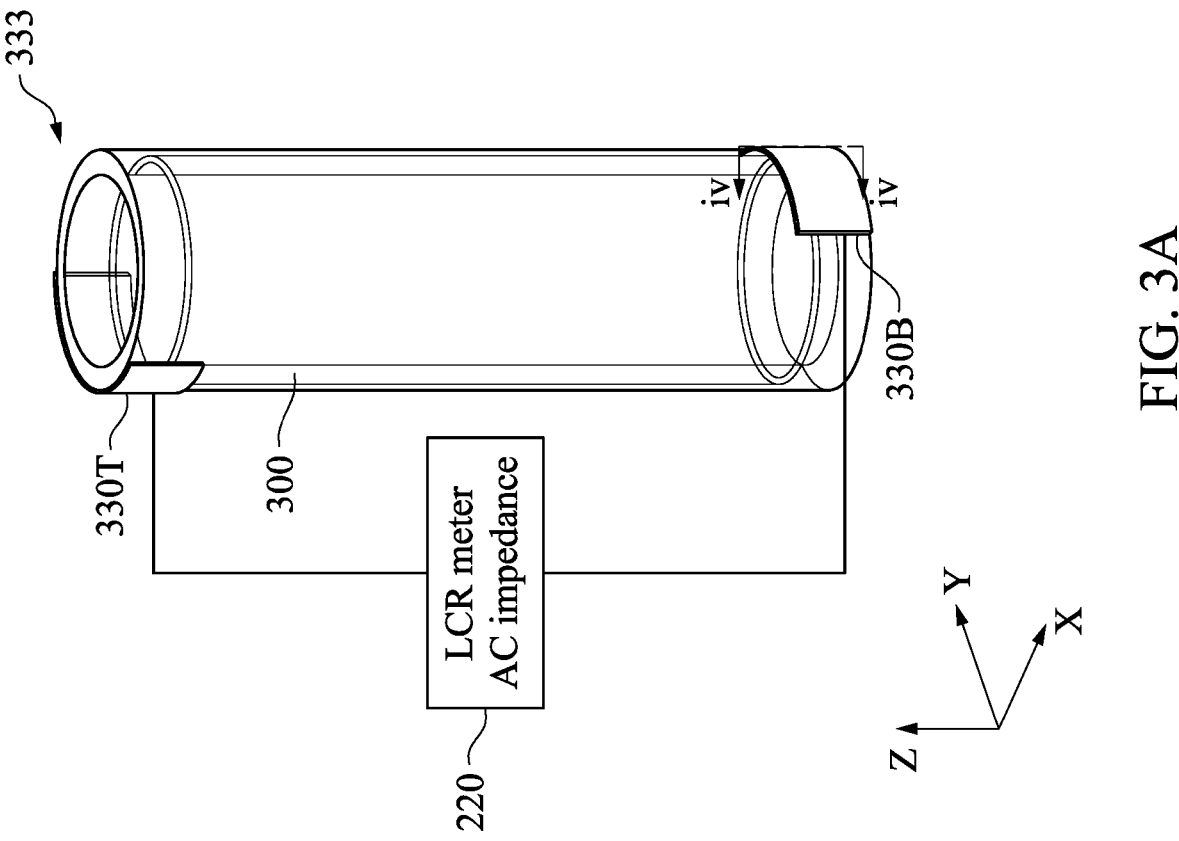
Figure 4:
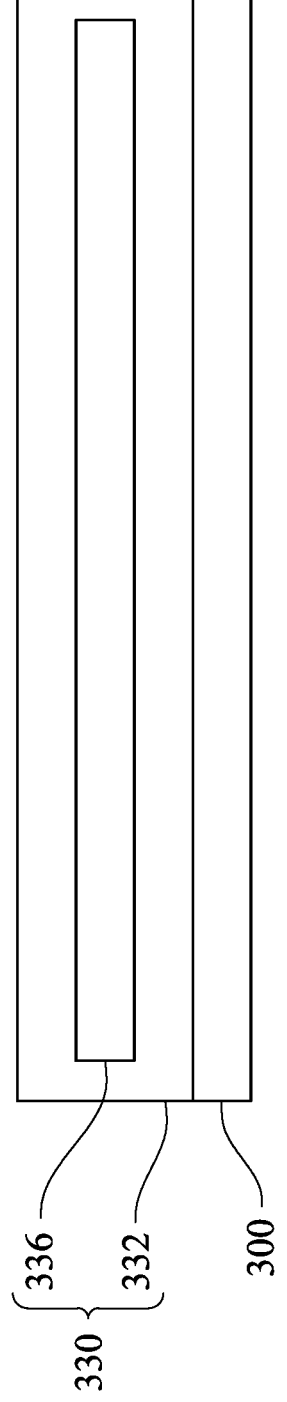
Figure 4:
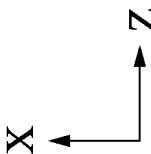

FIGS. 3A and 3B are diagrammatic perspective views of arrangements of electrodes 330B, 330T, 330L, 330R on a reservoir 333 in accordance with various embodiments. The electrodes 330B, 330T, 330L, 330R may be referred to collectively as the electrodes 330 and are the same as or similar to the electrodes 230 described with reference to FIG. 2. The reservoir 333 may be the same as or similar to the reservoir 233 described with reference to FIG. 2, such as a high-pressure reservoir 333 that operates to store liquid tin and provide the liquid tin to the droplet generator 30. FIG. 4 is a diagrammatic cross-sectional view of the electrode 330 along a cross-sectional line iv-iv shown in FIG. 3A.

In FIG. 3A, a top electrode 330T is attached to an upper portion of a sidewall 300 of the reservoir 333 and a bottom electrode 330B is attached to a bottom portion of the sidewall 300. The top electrode 330T and the bottom electrode 330B may not overlap each other. For example, the top electrode 330T may be attached to a first side of the sidewall 300 and the bottom electrode 330B may be attached to a second side of the sidewall 300 that is opposite the first side (e.g., offset 180 degrees for a cylindrical reservoir 333). The top electrode 330T may be offset from the bottom electrode 330B along a vertical or height axis (e.g., the Z-axis direction) of the reservoir 333 by about the height of the reservoir 333. It should be understood that the reservoir 333 depicted in FIG. 3A is shown with a top or cap thereof omitted from view. The "height" of the reservoir 333 just mentioned generally refers to a liquid tin storing portion of the reservoir 333 that would not include height of the top or cap. Similarly, the bottom of the reservoir 333 may have a thickness that is beneficial to prevent the reservoir 333 from bursting under elevated pressures. The thickness may also be omitted from the "height" of the reservoir 333. Namely, the top and bottom electrodes 330T, 330B may each partially or entirely overlap the liquid tin storing portion of the reservoir 333, which may be beneficial to obtaining a clear reading of the level of liquid tin in the reservoir 333.

In FIG. 3B, a right electrode 330R and a left electrode 330L may be attached at opposite sides of the sidewall 300. Instead of being offset from each other along the Z-axis direction, the right and left electrodes 330R, 330L may overlap each other along the Z-axis. The overlap may be partial or entire. The right and left electrodes 330R, 330L may be offset from each other along a circumference of the sidewall 300 as shown (e.g., in the XY plane) by a distance. The distance may be, for example, about one quarter of the circumference of the sidewall 300. In some embodiments, the distance is between about ⅛$^{th}$ the circumference and about ⅓$^{rd}$ the circumference. A closer distance may correspond to larger electrodes, whereas a further distance may correspond to better isolation between the two electrodes.

In FIG. 4, each of the electrodes 330 (or the electrodes 230) may include a conductive layer 336 that is surrounded by an insulating layer 332. The conductive layer 336 may be or include a material having high conductivity, such as copper, tin, silver, gold, aluminum, tantalum, zinc, nickel, alloys and/or multilayers thereof, combinations thereof, or the like. Thickness of the conductive layer 336 may be in a range of about 20 micrometers to about 1000 micrometers. In some embodiments, the conductive layer 336 is a copper foil that has thickness of about 50 micrometers. The insulating layer 332 may be a dielectric material that is capable of insulating the conductive layer 336 electrically from the reservoir 333. For example, the insulating layer 332 may be or include a polymer (e.g., polytetrafluoroethylene, polyethylene, polypropylene, polyurethane, or the like), silicone rubber, glass, ceramic, combinations thereof, or the like. A material that has low coefficient of thermal expansion, such as borosilicate glass or alumina or steatite ceramic may be beneficial to reducing variation of distance between the conductive layer and the liquid tin inside the reservoir 333, which may improve uniformity of capacitance readings by the LCR meter 220. The insulating layer 332 is attached to the sidewall 300 of the reservoir 333. The insulating layer 332 may be attached to the sidewall 300 via a separate adhesive layer (omitted from view), or a surface of the insulating layer 332 that faces the sidewall 300 may be adhesive itself.

Figure 5:
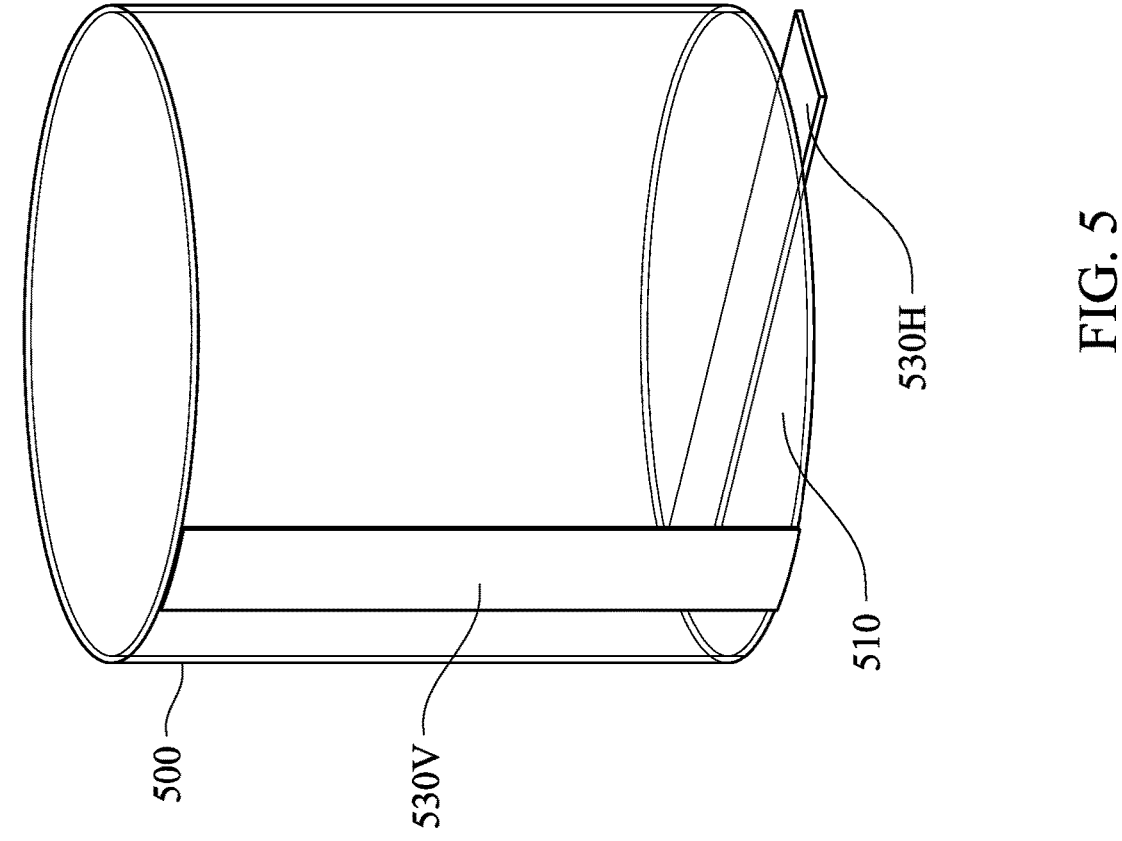
Figure 5:
Figure 5:
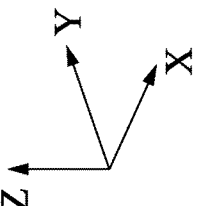

FIG. 5 is a diagrammatic perspective view of another reservoir 533 having vertical and horizontal electrodes 530V, 530H on a sidewall 500 and base wall 510 thereof, respectively. The reservoir 533 may be the same as or similar in most respects to the reservoirs 233, 333 described with reference to FIGS. 2-3B. The horizontal electrode 530H and the vertical electrode 530V may be referred to collectively as the electrodes 530 and may be the same as or similar in most respects to the electrodes 230, 330 described with reference to FIGS. 2-4.

The horizontal electrode 530H may be attached to the base wall 510 of the reservoir 533, may overlap a center or diameter of the base wall 510 and may extend from one edge of the base wall 510 to another edge of the base wall 510. In some embodiments, the horizontal electrode 530H is offset from the center or diameter of the base wall 510. For example, the horizontal electrode 530H may be between the vertical electrode 530V and the center of the base wall 510, or the center of the base wall 510 may be between the horizontal electrode 530H and the vertical electrode 530V. In some embodiments, the horizontal electrode 530H extends past at least one edge of the base wall 510, as depicted in FIG. 5. In some embodiments, the horizontal electrode 530H has one or both ends that terminate short of edges of the base wall 510.

The electrodes 530 may be substantially flat along their length. The horizontal electrode 530H may be flat along its length and width. The vertical electrode 530V may have curvature along its width that is substantially conformal to curvature of the sidewall 500. The inventors have found that, compared to the arrangements of electrodes 330 described with reference to FIGS. 3A and 3B, an "orthogonal" arrangement of electrodes as shown in FIG. 5 may have as much as a 2.5 times improvement in capacitance change resolution. Namely, a change in capacitance per centimeter of liquid tin level in the reservoir may be about 2.5 times larger when using the vertical and horizontal electrodes 530V, 530H that are orthogonal to each other instead of the electrodes 330 that are diagonal from each other (FIG. 3A) or opposite each other (FIG. 3B). For example, the electrodes 330 that are diagonal from each other may be associated with a capacitance change of about 0.04 pF/cm whereas the electrodes 530 that are orthogonal may be associated with a capacitance change of about 0.1 pF/cm. Another advantage associated with the vertical electrode 530V is sensitivity to changes in level of liquid tin along an entire height of the reservoir 533.

Figure 6:
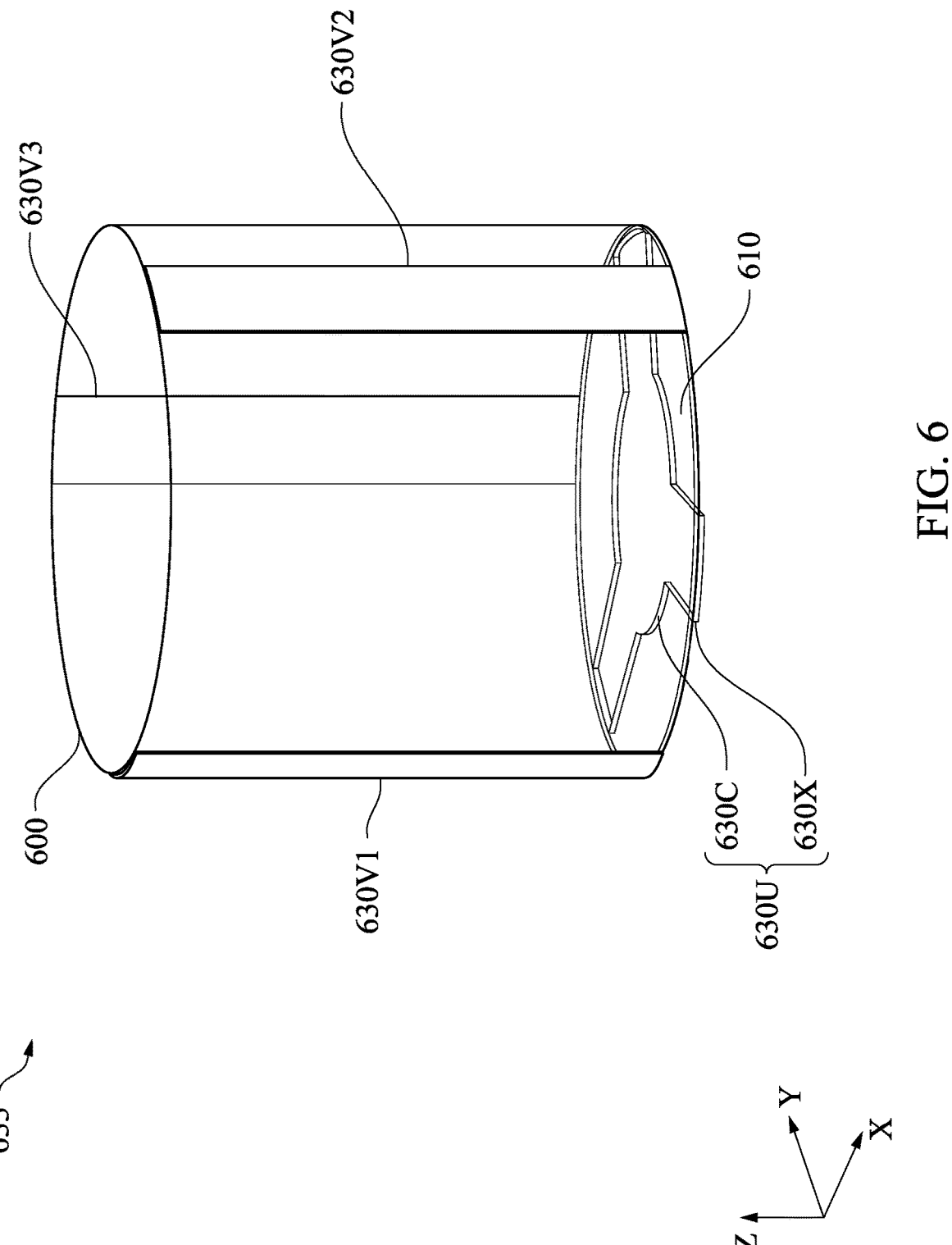

FIG. 6 is a diagrammatic perspective view of yet another reservoir 633 having multiple vertical electrodes 630V1, 630V2, 630 V3 and a base electrode 630U having a core electrode or central electrode region 630C and extension electrodes or extension electrode regions 630X on a sidewall 600 and bottom wall 610 thereof, respectively. The reservoir 633 may be the same as or similar in most respects to the reservoirs 233, 333, 533 described with reference to FIGS. 2-5. The vertical electrodes 630V1, 630V2, 630 V3 and the base electrode 630U may be referred to collectively as the electrodes 630 and may be the same as or similar in most respects to the electrodes 230, 330, 530 described with reference to FIGS. 2-5.

In FIG. 6, the electrodes 630 include three vertical electrodes 630V1, 630V2, 630 V3, which may be beneficial for enlarging measured capacitance. The vertical electrodes 630V1, 630V2, 630 V3 may be evenly spaced around the circumference of the reservoir 633 (e.g., offset from each other by 120 degrees), as shown, or may be spaced irregularly around the circumference of the reservoir 633. The vertical electrodes 630V1, 630V2, 630 V3 may each have the same width or may have different widths in the circumferential direction of the reservoir 633.

The base electrode 630U may be attached to a bottom wall 610 of the reservoir 633 and may include a core or central electrode region 630C and extension electrode regions 630X. The base electrode 630U may be a continuous whole. Namely, the extension electrode regions 630X may extend continuously from the central electrode region 630C instead of being individual elements attached thereto. The central electrode 630C may have a center that is aligned with a center of the bottom wall 610. The central electrode 630C may have diameter that is about half a diameter of the bottom wall 610. In some embodiments, the diameter of the central electrode 630C is in a range of about $\frac{1}{10}^{th}$ to about $\frac{3}{4}^{th}$ the diameter of the bottom wall 610. The extension electrodes 630X may extend from the central electrode 630C to an outer edge of the bottom wall 610. In some embodiments, the extension electrodes 630X extend to a level that is between about $\frac{2}{3}^{rd}$ to about the entire diameter of the bottom wall 610. The extension electrodes 630X may be arranged to be equidistant between neighboring pairs of the vertical electrodes 630V1, 630V2, 630 V3. For example, one of the extension electrodes 630X is arranged to be between the vertical electrode 630V1 and the vertical electrode 630V2. The one of the extension electrodes 630X may be equidistant from the vertical electrodes 630V1, 630V2 or may be closer to one of the vertical electrodes 630V1, 630V2 than the other.

Figure 7:
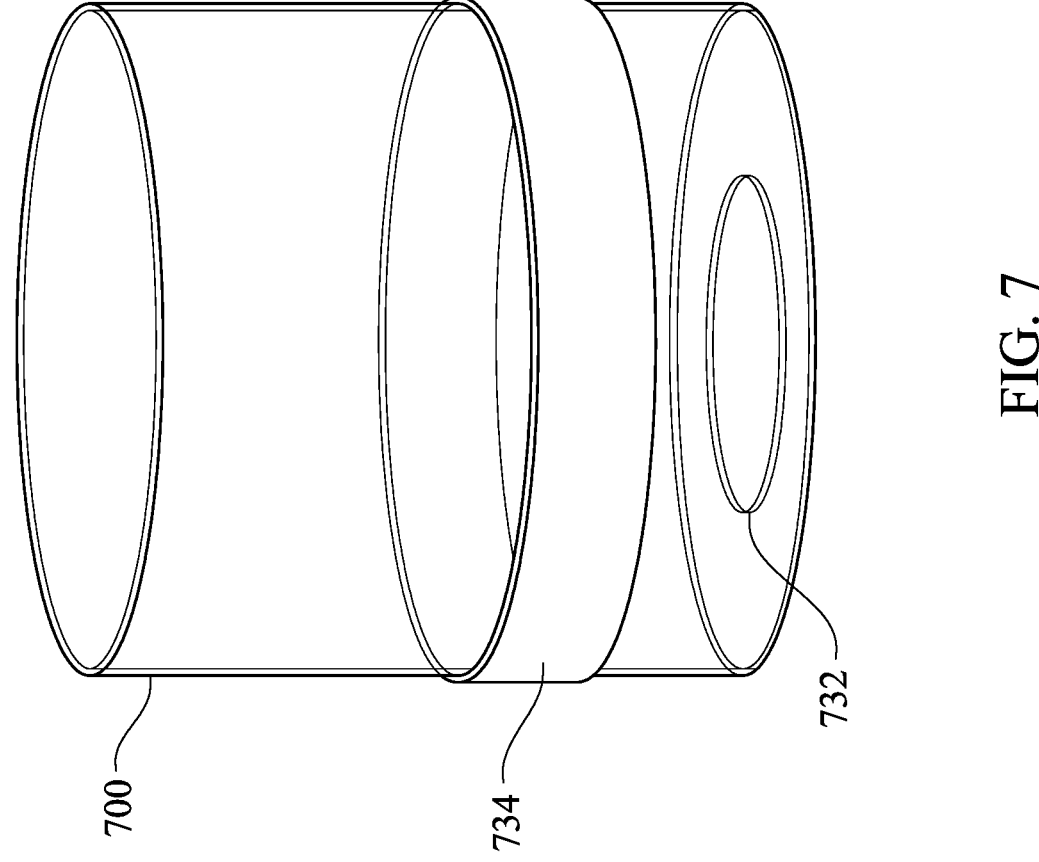
Figure 7:
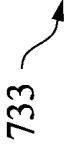
Figure 7:
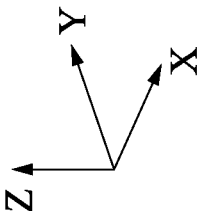

FIG. 7 is a diagrammatic perspective view of yet another reservoir 733 having a belt electrode 734 and a base electrode 732. The reservoir 733 may be the same as or similar in most respects to the reservoirs 233, 333, 533, 633 described with reference to FIGS. 2-6. The belt electrode 734 and the base electrode 732 may the same as or similar in most respects to the electrodes 230, 330, 530, 630 described with reference to FIGS. 2-6.

In FIG. 7, the base electrode 732 is attached to the bottom wall of the reservoir 733, and may have shape that is circular or another suitable shape. The base electrode 732 may have a center that is aligned with a center of the bottom wall of the reservoir 733. The base electrode may have diameter that is in a range of about $\frac{1}{4}^{th}$ to about the entire diameter of the bottom wall of the reservoir 733. In some embodiments, the base electrode 732 is offset from the center of the bottom wall.

The belt electrode 734 may be beneficial for precision liquid level sensing at a selected level range. The belt electrode 734 is attached to and extends fully around the circumference of the sidewall 700. In some embodiments, the belt electrode 734 may not extend fully around the circumference, but may extend most of the way around the circumference, such as more than 80% around the circumference. In some embodiments, the belt electrode 734 is positioned at a lower half of the reservoir 733, which may be beneficial to obtain precise measurement of the level of liquid tin when the level is low or the liquid tin is approaching being spent (e.g., the reservoir 733 is nearing empty). For example, the belt electrode 734 may be positioned at a level that is between about the bottom of the reservoir 733 and about half the height of the reservoir 733.

It should be understood that the various electrodes of the embodiments described with reference to FIGS. 2-7 may be combined or replaced in other embodiments. For example, the base electrode 732 may be replaced by the horizontal electrode 530H of FIG. 5 or the base electrode 630U of FIG. 6. In another example, the reservoir 733 of FIG. 7 may have more than one belt electrode 734 attached thereto, which may be arranged offset from each other along the height (e.g., Z-axis direction) of the reservoir 733.

Figure 8:
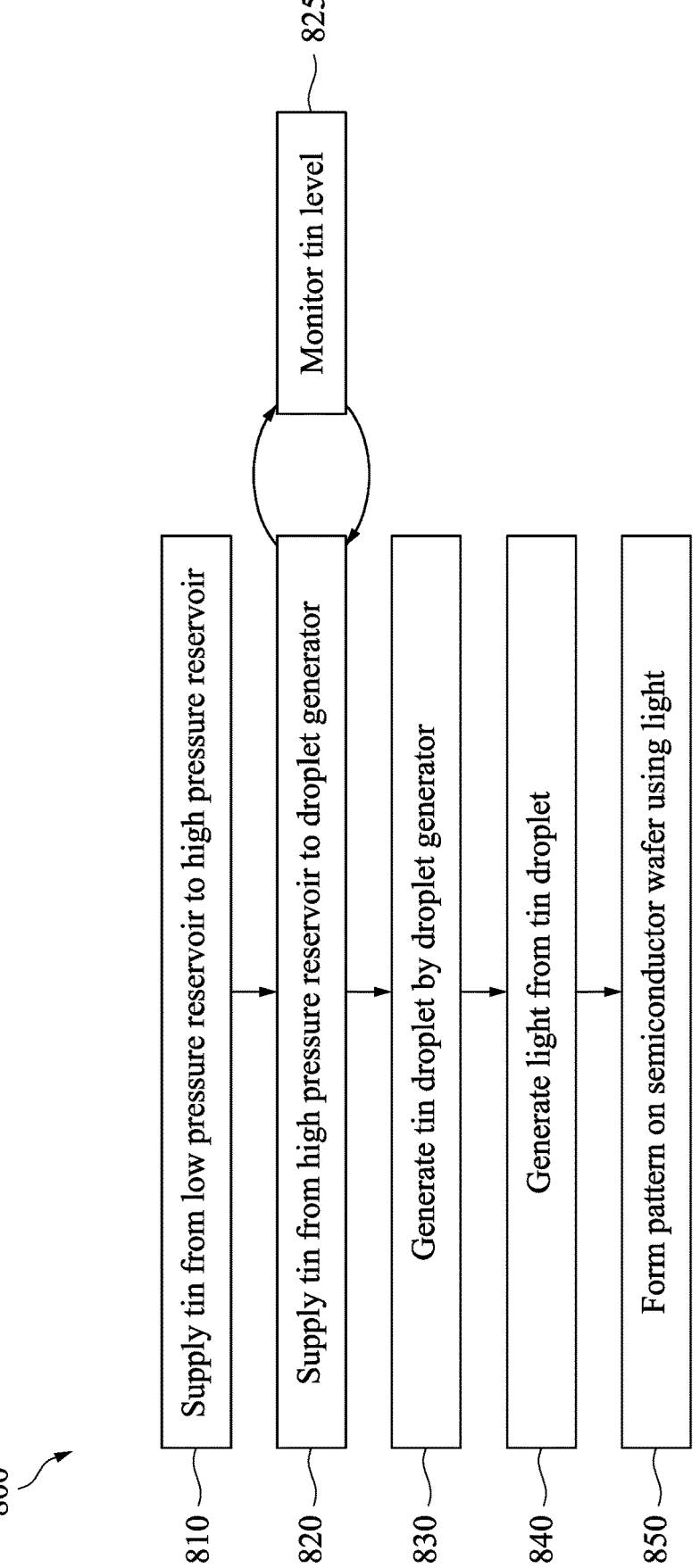
FIGS. 8 and 9 are flowcharts of methods of fabricating a device according to various aspects of the present disclosure.
Figure 9:
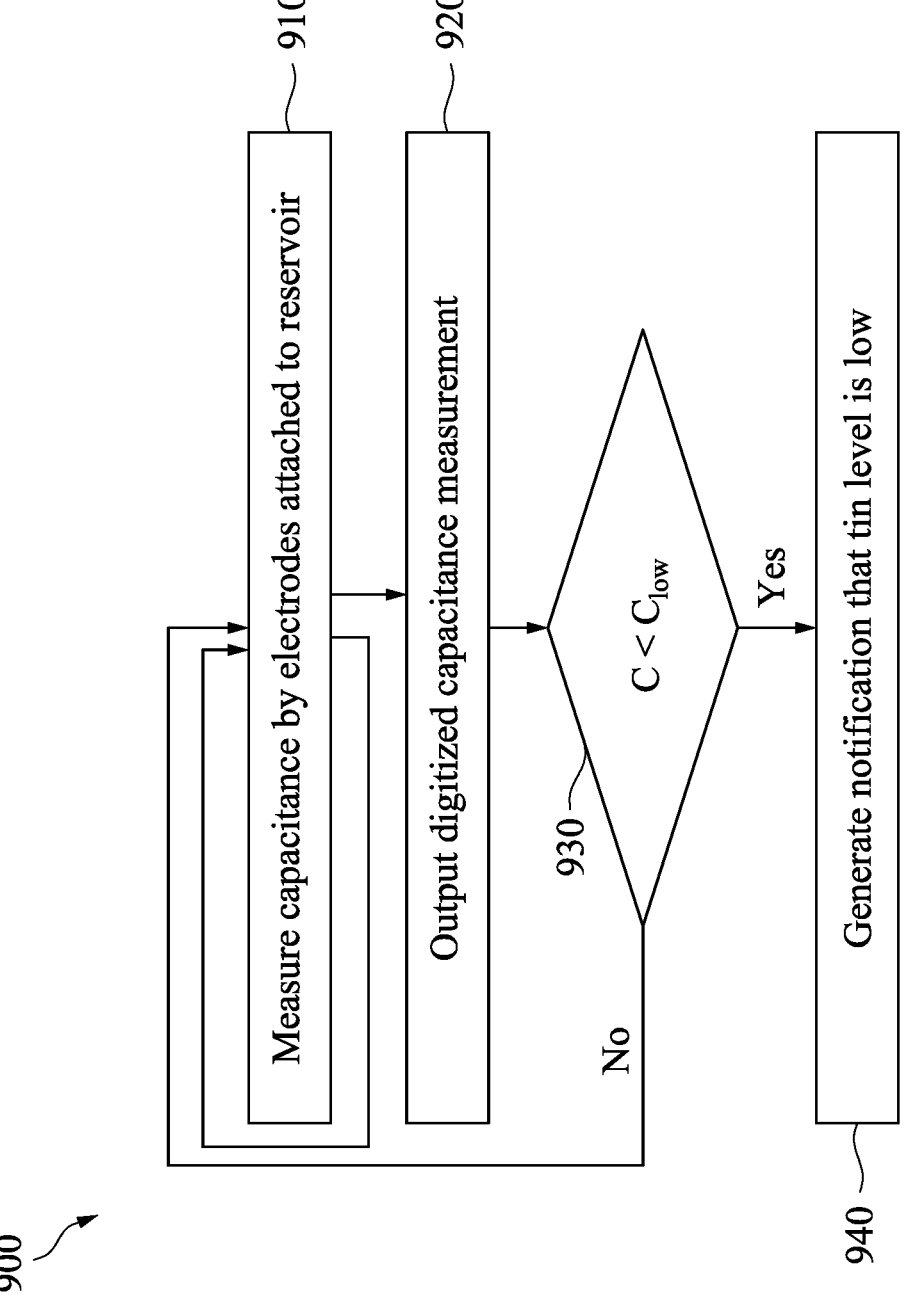

FIGS. 8 and 9 are flowcharts of processes 800, 900 in accordance with various embodiments. In some embodiments, the process 800 for forming a device includes a number of operations (810, 820, 830, 840 and 850). In some embodiments, the process 900 for monitoring level of liquid tin includes a number of operations (910, 920, 930 and 940). The processes 800, 900 will be further described according to one or more embodiments. It should be noted that the operations of the processes 800, 900 may be rearranged or otherwise modified within the scope of the various aspects. It should further be noted that additional processes may be provided before, during, and after the processes 800, 900, and that some other processes may be only briefly described herein. In some embodiments, the processes 800, 900 are performed by the lithography exposure system 10, supply system 20 and measurement system 200 described in FIGS. 1A-7. The embodiments are described with reference to the structural elements described in FIGS. 1A-7, but the processes 800, 900 may be performed by a lithography exposure system, supply system and measurement system having one or more structural elements that are different from those of the lithography system 10, supply system 20 and measurement system 200.

In operation 810, tin is supplied from a low-pressure reservoir (e.g., the reservoir 232) to a high-pressure reservoir (e.g., the reservoir 233). The tin may be liquid tin that is formed from solid tin that is melted in another low-pressure reservoir (e.g., the reservoir 231) that is upstream from the low-pressure reservoir that supplies the high-pressure reservoir. The tin may be supplied to the high-pressure reservoir as described with reference to FIG. 2.

In operation 820, the liquid tin is supplied from the high-pressure reservoir to a droplet generator (e.g., the droplet generator 30). Operations 810 and 820 may be performed simultaneously. For example, during as supplying liquid tin from the high-pressure reservoir to the droplet generator depletes liquid tin in the high-pressure reservoir, the low-pressure reservoir may be supplying additional liquid tin to the high-pressure reservoir so as to maintain a substantially constant level of liquid tin in the high-pressure reservoir.

During supplying of liquid tin to the droplet generator from the high-pressure reservoir in operation 820, the level of liquid tin in the high-pressure reservoir is monitored in operation 825. Monitoring of the level of liquid tin is described in detail with reference to FIG. 2. Namely, capacitance associated with the level may be measured by the LCR meter 220 that is electrically connected to electrodes, such as the electrodes described with reference to FIGS. 3A-7. The monitoring of operation 825 may be performed by the processor 226 of FIG. 2 that receives the digital signal from the ADC 224 or alternatively from the LCR meter 220. The operation 825 may be a process that includes multiple operations. The process 900 described below with reference to FIG. 9 is one embodiment of the operation 825.

In operation 830, tin droplets (e.g., the tin droplets 82 of FIG. 1B) are generated by the droplet generator, which may be similar to that described with reference to FIGS. 1A and 1B.

In operation 840, light is generated from the tin droplets. Generation of EUV light from tin droplets is described in detail with reference to FIGS. 1A and 1B.

In operation 850, a pattern is formed on a semiconductor wafer using the light generated from the tin droplets. For example, radiation is reflected from the collector 60 and directed toward the mask layer 26. The radiation is reflected along an optical path between the collector 60 and the mask layer 26, which may be on the semiconductor wafer 22, such as is illustrated in FIG. 1A. In some embodiments, the radiation is reflected according to a pattern, such as exists on the mask 18, which may be a reflective mask. The radiation may be EUV light having wavelength centered at about 13.5 nm. The radiation having the pattern may expose a photo-sensitive layer, such as a photoresist, on a surface of the wafer, such that the pattern is transferred to the photosensitive layer. Then, openings may be formed in the mask layer 26 by removing pattern regions of the mask layer 26 exposed to the radiation. In some embodiments, the openings are formed by removing regions of the mask layer 26 not exposed to the radiation. Then, material of one or more layers underlying the mask layer 26 is removed, forming second openings. The material removed is in regions of the layer exposed by the openings in the mask layer 26. In some embodiments, the layer is a dielectric layer, a semiconductor layer, or other layer. Then, features are formed in the second openings of the layer. For example, source/drain regions may be epitaxially grown in the second openings. In another example, metal traces may be deposited in the second openings. In yet another example, gate structures including a high-k dielectric layer and a metal layer may be formed in the second openings.

FIG. 9 is a flowchart of a process 900 that is one embodiment of the operation 825 of FIG. 8. The process 900 may be performed to monitor the level of liquid tin in the reservoir.

The process 900 begins operation 910 in which capacitance is measured by electrodes attached to a reservoir that contains liquid tin. Operation 910 may be performed by the LCR meter 220 described with reference to FIG. 2. The measuring may include inputting a high-frequency analog signal to the electrodes 230 and measuring a frequency response by the LCR meter 220. Operation of the LCR meter 220 is described in detail with reference to FIG. 2.

In operation 920, a digitized capacitance measurement associated with the frequency response is outputted to, for example, a processor or controller (e.g., the processor 226). The digitized capacitance measurement may be the digital signal outputted by the ADC 224 described with reference to FIG. 2. The digitized capacitance measurement may be generated by converting the analog signal outputted by the LCR meter 220 to the digital signal by the ADC 224. In some embodiments, the LCR meter 220 outputs the digital signal when the LCR meter 220 is a digital meter capable of outputting digital signals directly instead of outputting the analog signal.

In operation 930, a determination is made whether capacitance C of the electrodes is less than a low level threshold $C_{low}$. The determination may be made by the processor 226 as described with reference to FIG. 2. For example, the processor 226 may store a capacitance value in a register of a memory based on the digital signal, then may compare the capacitance value with the low level threshold $C_{low}$. Based on a result of the comparison, the processor 226 may determine that the capacitance value exceeds or is less than the low level threshold $C_{low}$. When the capacitance value exceeds the low level threshold $C_{low}$, corresponding to the level of liquid tin in the reservoir being above a low level below which a notification should be issued, the process 900 continues with operations 910 and 920 to measure capacitance of the electrodes. When processor 226 determines that the capacitance value is below the low level threshold $C_{low}$, the processor 226 may take any of the actions described with reference to FIG. 2, such as generating a notification that level of the liquid tin is low in operation 940. In some embodiments, instead of or in addition to, generating the notification in operation 940, the processor 226 may output a continuous measurement of the level of liquid tin in the reservoir by outputting the capacitance value to a monitoring system, such as a supervisory control and data acquisition (SCADA) system, a manufacturing execution system (MES), or the like. The continuous measurement may be a percentage, a volume of liquid tin, or other suitable measurement that may be displayed on a user interface of a user terminal, for example.

Embodiments may provide advantages. The measurement system 200 includes electrodes that are attached to the high-pressure reservoir, which allows for non-invasive and precise measurement of level of liquid tin in the high-pressure reservoir. Improving measurement of the level of liquid tin reduces the occurrence of abrupt stops in the flow of liquid tin, which protects the lithography system 10 and the supply system 20, and can reduce downtime for repairs and restarting of the lithography system 10 and/or the supply system 20.

In accordance with at least one embodiment, a method includes: forming a mask layer on a semiconductor wafer; forming a tin droplet, including: supplying tin to a high-pressure reservoir from a low-pressure reservoir; monitoring a level of tin in the high-pressure reservoir by at least two electrodes attached to the high-pressure reservoir; in response to the level of the tin exceeding a threshold value, supplying the tin to a droplet generator from the high-pressure reservoir; forming the tin droplet by the droplet generator using the tin supplied from the high-pressure reservoir; generating light by the tin droplet; and patterning the mask layer by the light.

In accordance with at least one embodiment, a method includes: forming a tin droplet, including: monitoring a level of tin in a reservoir by at least two electrodes attached to the reservoir; in response to the level of the tin exceeding a threshold value, supplying the tin to a droplet generator from the reservoir; and forming the tin droplet by the droplet generator using the tin supplied from the reservoir; and generating extreme ultraviolet (EUV) light by the tin droplet.

In accordance with at least one embodiment, a system includes: a light source including: a droplet generator; a reservoir in fluid communication with the droplet generator; a monitoring assembly that, in operation, measures capacitance associated with level of tin in the reservoir, the monitoring assembly having at least two electrodes attached to an exterior of the reservoir; and a collector that, in operation, forms a beam of light based on a tin droplet formed by the droplet generator; and at least one reflector that, in operation, directs the beam of light toward a wafer stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a mask layer on a semiconductor wafer;
forming a tin droplet, including:
   supplying tin to a high-pressure reservoir from a low-pressure reservoir;
   monitoring a level of tin in the high-pressure reservoir by at least two electrodes attached to the high-pressure reservoir;
   in response to the level of the tin exceeding a threshold value, supplying the tin to a droplet generator from the high-pressure reservoir; and
   forming the tin droplet by the droplet generator using the tin supplied from the high-pressure reservoir;
generating light by the tin droplet; and
patterning the mask layer by the light.

2. The method of claim 1, wherein the monitoring a level of tin includes:
measuring a capacitance value by an electric meter coupled to the at least two electrodes.

3. The method of claim 2, wherein the measuring a capacitance includes:
applying an alternating current (AC) signal to the at least two electrodes, the AC signal having frequency in a range of about 1 kilohertz to about 1 megahertz.

4. The method of claim 2, wherein the monitoring a level includes applying a signal to at least two electrodes that include:
a first electrode attached to a sidewall of the high-pressure reservoir at a first vertical level; and
a second electrode attached to the sidewall at a second vertical level offset from the first vertical level.

5. The method of claim 4, wherein the first and second electrodes are on opposing sides of the high-pressure reservoir along a horizontal direction.

6. The method of claim 2, wherein the monitoring a level includes applying a signal to at least two electrodes that include:
a first electrode that extends vertically along a sidewall of the high-pressure reservoir; and

a second electrode that extends horizontally along a base of the high-pressure reservoir.

7. The method of claim 2, wherein the monitoring a level includes applying a signal to at least two electrodes that include:
a first electrode attached to a base of the high-pressure reservoir; and
at least two second electrodes that extend vertically along a sidewall of the high-pressure reservoir.

8. The method of claim 7, wherein:
the first electrode includes an inner portion and at least two extension portions that extend outward from the inner portion; and
the at least two second electrodes are positioned in gaps between the at least two extension portions.

9. The method of claim 2, wherein the monitoring a level includes applying a signal to at least two electrodes that include:
a first electrode attached to a base of the high-pressure reservoir; and
a second electrode that wraps entirely around a sidewall of the high-pressure reservoir.

10. A method, comprising:
forming a tin droplet, including:
   monitoring a level of tin in a reservoir by at least two electrodes attached to the reservoir;
   in response to the level of the tin exceeding a threshold value, supplying the tin to a droplet generator from the reservoir; and
   forming the tin droplet by the droplet generator using the tin supplied from the reservoir; and
generating extreme ultraviolet (EUV) light by the tin droplet.

11. The method of claim 10, wherein the monitoring a level includes:
measuring a capacitance by an LCR meter connected to the at least two electrodes;
generating a digital capacitance by an analog-to-digital converter (ADC) connected to the LCR meter;
determining the level of the tin by a processor connected to the ADC; and
in response to the level of the tin being below the threshold value, generating a notification.

12. The method of claim 11, wherein the generating a notification includes generating an alarm.

13. The method of claim 11, wherein the generating a notification includes outputting real-time data associated with the level of the tin.

14. The method of claim 13, further comprising:
controlling supply of tin to the reservoir based on the real-time data.

* * * * *